(12) United States Patent
Chan et al.

(10) Patent No.: US 11,996,686 B2
(45) Date of Patent: May 28, 2024

(54) CLOCK SYNC INPUT DROPOUT PROTECTION

(71) Applicant: TEXAS INSTRUMENTS INCORPORATED, Dallas, TX (US)

(72) Inventors: Chung San Roger Chan, Coppell, TX (US); John Mitchell Perry, McKinney, TX (US); Ari Arie Levy, Frisco, TX (US); Nghia Trong Tang, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 45 days.

(21) Appl. No.: 17/538,479

(22) Filed: Nov. 30, 2021

(65) Prior Publication Data
US 2023/0056382 A1   Feb. 23, 2023

Related U.S. Application Data

(60) Provisional application No. 63/235,097, filed on Aug. 19, 2021.

(51) Int. Cl.
*G06F 1/12* (2006.01)
*G06F 1/10* (2006.01)
*H02H 1/00* (2006.01)
*H03K 3/017* (2006.01)

(52) U.S. Cl.
CPC .............. *H02H 1/0007* (2013.01); *G06F 1/10* (2013.01); *G06F 1/12* (2013.01); *H03K 3/017* (2013.01)

(58) Field of Classification Search
CPC ........... H02H 1/0007; G06F 1/10; G06F 1/12; H03K 3/017; H03K 5/19
USPC ............................................ 327/20
See application file for complete search history.

(56) References Cited

U.S. PATENT DOCUMENTS

| | | | | |
|---|---|---|---|---|
| 6,891,409 B2* | 5/2005 | Furuya | ................. | G06F 1/3203 327/99 |
| 7,038,506 B2* | 5/2006 | Om | ........................ | G06F 1/24 327/145 |
| 7,196,554 B2* | 3/2007 | Taskin | ..................... | G11C 7/22 327/407 |
| 7,400,178 B2* | 7/2008 | Wong | ....................... | G06F 1/10 713/400 |
| 8,570,014 B2* | 10/2013 | Laur | ...................... | H03K 5/135 323/283 |
| 9,292,038 B1* | 3/2016 | Ozalevli | ................. | G06F 1/263 |
| 9,362,927 B2* | 6/2016 | Laur | ...................... | H03K 5/135 |
| 2023/0056382 A1* | 2/2023 | Chan | ........................ | G06F 1/10 |

* cited by examiner

*Primary Examiner* — Ryan Jager
(74) *Attorney, Agent, or Firm* — Michelle F. Murray; Frank D. Cimino (57) ABSTRACT

In a described example, a circuit includes a synchronization control circuit having a sync input and a sync control output, in which the sync input is coupled to a sync terminal configured to receive an external clock signal. An internal clock generator circuit has a control input and an output. The control input is coupled to the sync control output. An output circuit has first and second signal inputs, a mode control input and a clock output. The first signal input is coupled to the sync input, and the second signal input of the output circuit is coupled to the output of the internal clock generator circuit. The mode control input is coupled to the sync control output, and the clock output adapted to be coupled to a controller.

20 Claims, 7 Drawing Sheets

CLOCK SYNC INPUT DROPOUT PROTECTION

CROSS REFERENCE TO RELATED APPLICATION

This application claims priority to U.S. Provisional Patent Application No. 63/235,097, filed on Aug. 19, 2021, which is incorporated herein by reference in its entirety.

TECHNICAL FIELD

This description relates to dropout protection for a clock synchronization input.

BACKGROUND

Electrical charging systems, such as for universal serial buses (USBs), can include multiple output ports. One or more loads (e.g., electrical devices) can be coupled individually to a respective output port for charging. The electrical charging system can be configured to sense current provided to its output ports and implement protective actions responsive to the sensed current and other monitored load conditions. The manner in which the electrical charging system implements the protection can vary according to system protection requirements, such as can be established by industry standards as well as user requirements. Various tests can be designed to ensure that the electrical charging system meets or exceeds the established standards.

SUMMARY

In a described example, a circuit includes a synchronization control circuit having a sync input and a sync control output, in which the sync input is coupled to a sync terminal configured to receive an external clock signal. An internal clock generator circuit has an output. An output circuit has a first input, a second input, a mode control input and a clock output. The first signal input is coupled to the sync input, and the second signal input of the output circuit is coupled to the output of the internal clock generator circuit. The mode control input is coupled to the sync control output, and the clock output adapted to be coupled to a controller.

In another described example, a circuit includes a synchronization control circuit configured to provide a sync control signal responsive to determining an invalidity or validity of an external clock signal. An internal clock generator is configured to provide an internal clock signal. An output circuit is configured to provide one of the external clock signal and the internal clock signal as an output clock signal responsive to the sync control signal.

In yet another described example, a system includes a dropout protection circuit, including a synchronization control circuit, an internal clock generator circuit, and an output circuit. The synchronization control circuit has a sync input and a sync control output. The sync input is coupled to a sync terminal configured to receive an external clock signal. The internal clock generator circuit has a control input and an output, in which the control input coupled to the sync control output. The output circuit has a first signal input, a second signal inputs, a mode control input and a clock output. The first signal input is coupled to the sync input. The second signal input of the output circuit is coupled to the output of the internal clock generator circuit, and the mode control input is coupled to the sync control output. A controller has a clock input and a control output, in which the clock input is coupled to the clock output of the output circuit. A power converter has a power control input coupled to the control output of the controller.

DETAILED DESCRIPTION

Example embodiments relate to circuits and systems to implement dropout protection for a clock synchronization input, so a substantially continuous clock signal can be maintained for one or more power converters or other circuitry. For example, a synchronization control circuit is configured to provide a synchronization (also referred to in this description as 'sync') control signal responsive to determining an invalidity or validity of an external clock signal. The synchronization control circuit can be configured to provide the sync control signal to specify whether the frequency and/or quality of the external clock signal is valid or invalid. An internal clock generator can be configured to provide an internal clock signal, which can be continuously provided or provided responsive to the sync control signal having a value representative of an invalid external clock signal. An output circuit can be configured switch in and out of the external clock signal and the internal clock signal as an output clock signal responsive to the sync control signal. In this way, a clock signal can be provided regardless of the validity of the external clock signal.

Compared to a dropout protection circuit that uses a phase-locked loop (PLL) to lock onto an external frequency, the dropout protection circuit described herein is simpler, which requires less area and consumes less power. The approach described herein also allows a seamless integration with an external clock signal, such as are implemented on power converters as well as other integrated circuits that can be coupled together for synchronization. The approach described herein can also automatically switch in and out of the external clock source, without disturbing the power converter or other circuitry.

Figure 1:
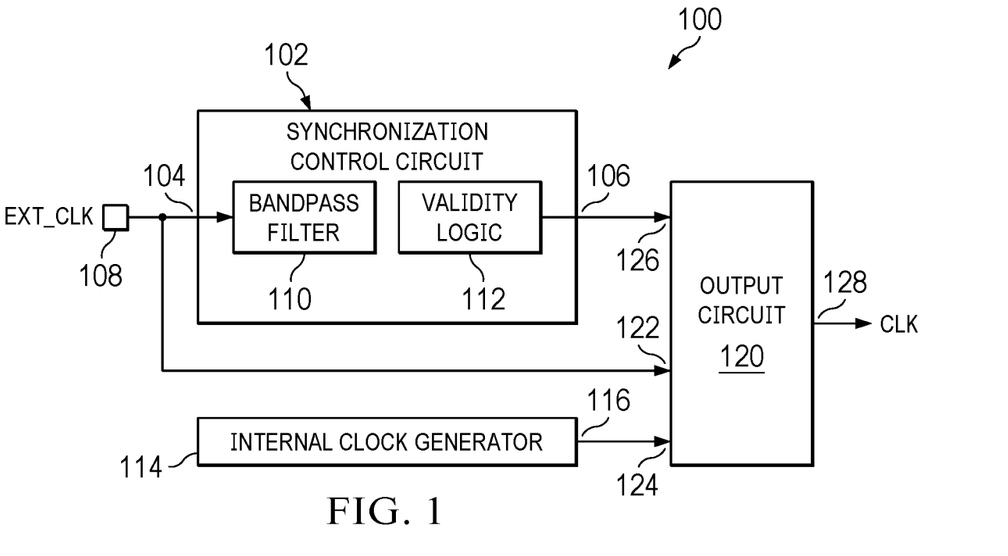
FIG. 1 shows an example clock dropout protection circuit.

FIG. 1 shows an example dropout protection circuit 100. The circuit 100 includes a synchronization control circuit 102 having a sync input 104 and a sync control output 106. The sync input 104 is coupled to a sync_in terminal 108 configured to receive an external clock signal, shown as EXT_CLK. The synchronization control circuit 102 is configured to provide a sync fail signal at the sync control output 106 responsive to determining a frequency and/or quality of the external clock signal is invalid. In an example, the synchronization control circuit 102 includes a bandpass filter 110 and validity logic 112.

The bandpass filter 110 is configured to filter the EXT_CLK signal according to a pass band so clock signals within a frequency range defined by the pass band are provided to the validity logic 112. The pass band of the filter 110 can be configurable, such as by setting a register entry. For example, if the EXT_CLK signal has a frequency outside of the pass band, the EXT_CLK signal can be determined to be invalid (e.g., too high or too low). If the EXT_CLK signal has a frequency within the pass band, the signal can be passed to the validity logic as a potentially valid signal. The validity logic 112 is configured to monitor the EXT_CLK signal (e.g., from the bandpass filter 110) over a number of cycles (e.g., one or more cycles) to determine whether the EXT_CLK signal is valid. The number of cycles can be configurable. For example, the validity logic can provide the sync control signal at 106 with a value representative of whether the EXT_CLK signal is valid or invalid.

Also, responsive to determining that the EXT_CLK signal is considered invalid, the validity logic 112 can be configured to monitor (e.g., count) the EXT_CLK signal for a number of valid cycles before classifying the EXT_CLK signal as valid again. The number of valid cycles following an invalid EXT_CLK signal can be configurable. In some examples, hysteresis can be added to a minimum period for the EXT_CLK signal and be subtracted from the maximum period for the EXT_CLK signal. The hysteresis portion helps ensure that when the EXT_CLK signal is classified as valid again, the EXT_CLK signal is comfortably beyond those limits, so the synchronization control circuit does not immediately (or over time) fail responsive to a transition from an invalid to a valid EXT_CLK signal.

The circuit 100 also includes an internal clock generator circuit 114 having an output 116. The internal clock generator 114 is configured to generate a clock signal having a frequency and duty cycle (e.g., 50%). The frequency can be configurable according to application requirements, such as responsive to a value of a register entry or other variable input. In an example, the internal clock frequency matches the frequency of the EXT_CLK signal. The internal clock generator 114 can include an oscillator configured to provide the internal clock signal independently of the EXT_CLK signal. In another example, the internal clock generator 114 is configured to be activated to provide the internal clock signal responsive to the synchronization control circuit 102 determining an invalid EXT_CLK signal.

The circuit 100 also includes an output circuit 120 having first and second signal inputs 122 and 124, a mode control input 126 and an output 128. The first signal input 122 is coupled to the sync input 104 and thus is configured to receive the EXT_CLK signal. The second signal input 124 is coupled to the output 116 of the internal clock generator circuit 114 and thus is configured to receive the internal clock signal. The mode control input 126 is coupled to the sync control output 106 and thus is configured to receive the sync control signal. The output circuit 120 is configured to couple the output 128 to one of the first or second signal inputs responsive to the sync control signal. For example, the output circuit 120 is configured to couple the output 128 to the input 122 (also the input 104) responsive to a valid EXT_CLK signal so the EXT_CLK signal is provided at the output 128. The output circuit 120 is also configured to couple the output 128 to the input 124 (also the output 116) responsive to an invalid EXT_CLK signal so the internal clock signal is provided at the output 128. The output circuit 120 can be implemented as a switch, a multiplexer as well as other circuitry configured to pass a selected clock signal to the output 128.

The output 128 is adapted to be coupled to other circuitry, such as a controller or other circuit configured to use a clock signal. By providing either the internal clock signal or valid EXT_CLK signal, such other circuitry can continue to operate within expected operating parameters. In the example of a DC/DC power converter configured to use the EXT_CLK signal, problems can occur when the EXT_CLK signal is dropped out. For example, the DC/DC converter can stall suddenly, halt a state machine, as well as damage the device or the components that rely on the regulated output from the converter. The dropout protection circuit described herein helps to ensure that the converter does not stall for too long responsive to the EXT_CLK signal dropping out. The dropout protection circuit described herein also provides a simpler approach that requires less area and consumes less power compared to some existing solutions (e.g., PLL based dropout protection).

Figure 2:
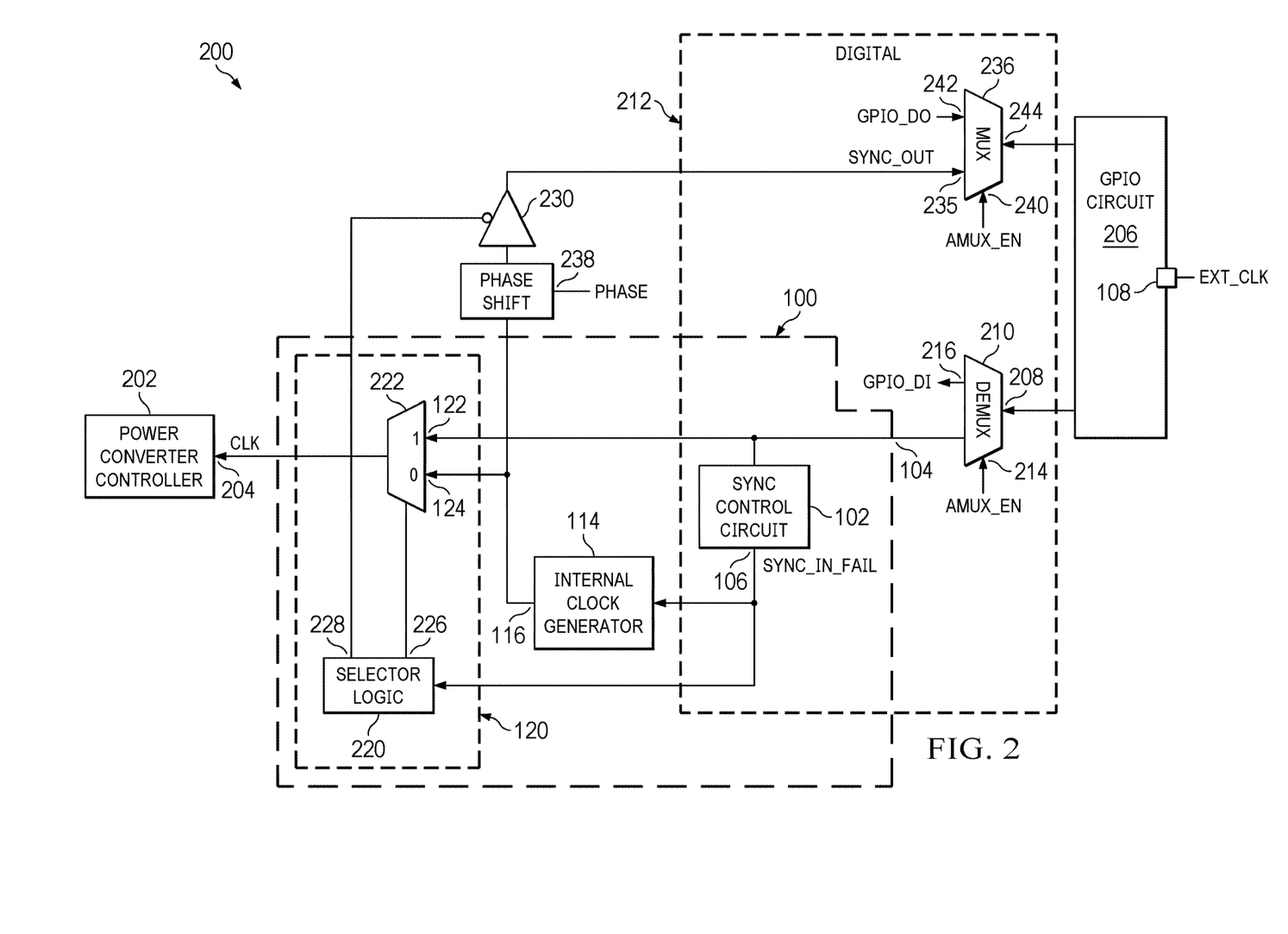
FIG. 2 shows an example of dropout protection circuit implemented in a power delivery control system.

FIG. 2 is a block diagram of an example power delivery system 200 that includes a dropout protection circuit 100. The dropout protection circuit can be implemented according to the example of FIG. 1. Accordingly, the description of FIG. 2 also refers to FIG. 1. In an example, the power delivery system 200 is implemented on an integrated circuit (IC) or system on chip (SoC), which can include a power converter and other circuitry integrated with the power delivery system 200. The power delivery system 200 includes a power converter controller (e.g., having a state machine) 202 having an input 204 configured to receive a clock (CLK) signal from the dropout protection circuit 100. Thus, as described herein, the CLK signal is either an external clock (EXT_CLK) signal, which is received at sync_in terminal 108, or an internal clock signal generated by the dropout protection circuit 100. In an example, the sync_in terminal 108 is a sync-out/sync-in pin of a universal serial bus (USB) controller, such as a USB Type-C power delivery controller, in which the sync-out is configured to provide a master clock for controlling one or more external DC-DC regulators. For example, the controller 202 is a power delivery controller configured to generate a pulse-width modulated (PWM) signal for controlling a power stage of the DC-DC regulator responsive to the CLK signal.

The power delivery system 200 also includes a general purpose input/output (GPIO) circuit 206 having the sync_in terminal 108. The sync_in terminal 108 can be configured as an input or an output depending on the operating state of the GPIO circuit 206. For example, in an input state, the GPIO circuit 206 is configured to receive the EXT_CLK signal as an input and to pass the EXT_CLK signal to an input 208 of a demultiplexer 210. The demultiplexer 210 can be implemented as part of digital circuitry 212 of the power delivery system 200. The demultiplexer 210 has a control input 214, a sync output coupled to the sync input 104 as well as a data output 216. The demultiplexer 210 is configured to pass the EXT_CLK signal from the input 208 (received from the GPIO circuit 206) to the sync input 104 responsive to an enable signal provided at the control input 214.

The sync control circuit 102 is configured to monitor the EXT_CLK signal and determine whether the EXT_CLK signal is valid or invalid. For example, the synchronization control circuit 102 is configured to provide a sync control signal at the sync control output 106 with a value representative an invalid EXT_CLK signal responsive to determining a frequency and/or quality of the external clock signal is invalid. The sync control signal can be provided to the output circuit 120. In some examples, the sync control signal can also be provided to the internal clock generator 114, such as when the internal clock generator is activated responsive to detecting an invalid EXT_CLK signal. In other examples, the internal clock generator 114 is configured to provide the internal clock signal in a continuous manner independent of the EXT_CLK signal. The internal clock generator 114 provides the internal clock signal to the input 124 of the output circuit 120.

In the example of FIG. 2, the output circuit 120 includes selector logic 220 and a multiplexer 222. The selector logic 220 includes an input 224 and outputs 226 and 228. The input 224 is coupled to the output 106 of the sync control circuit 102. The output 226 is coupled to a control input of the multiplexer 222 and the other output is coupled to an inverting drive input of a buffer 230. In an example, the selector logic 220 can be configured to provide a sync output control signal at the output 228 responsive to the sync control signal at 106. In another example, the sync control circuit 102 generates a sync mode signal representative of a mode of the dropout protection circuit 100, and the selector logic 220 is configured to provide the sync output control signal at 228 responsive to the sync mode signal.

The multiplexer 222 is configured to select which input signal (e.g., the EXT_CLK signal at 122 or the internal clock signal at 124) the multiplexer 222 outputs to provide the CLK signal responsive to the selector signal at 226. Thus, if the sync control circuit 102 determines the EXT_CLK signal is invalid, the multiplexer 222 is configured to provide the internal clock signal to the input 204 of the controller 202 as the CLK signal. Alternatively, if the sync control circuit 102 determines the EXT_CLK signal is valid (e.g., remaining valid or responsive to transitioning back to a valid condition), the multiplexer 222 is configured to pass the EXT_CLK signal to the input 204 of the controller 202 as the CLK signal. As a result, the power converter controller 202 is configured to receive the CLK signal on a continuous basis, which enables continued operation of a power converter (not shown) without stalling and without adversely affecting associated circuits and devices that rely on the power converter for power.

Also, in the example of FIG. 2, the output 116 of the internal clock generator 114 is coupled to the input of a phase shift circuit 234. The phase shift circuit 234 has an output coupled to the buffer 230, and the buffer is coupled to an input 235 of another multiplexer 236. The multiplexer 236 has a control input 240, a data input 242 and an output 244. The output is coupled to the GPIO circuit 206, and the data input is configured to receive output data from other circuitry within the system 200. The phase shift circuit 234 is configured to apply a phase shift to the internal clock signal at 116, such as responsive to a PHASE signal provided at a phase command input 238. The buffer 230 is configured to provide an output clock signal to the input 235 of multiplexer 236 responsive to the phase-shifted internal clock signal. For example, the multiplexer 210 is configured to pass one of the output clock signal at 235 or the data signal at 242 to the GPIO circuit 206. Provided that the GPIO circuit 206 is enabled the selected signal at 235 or 242 can be propagated to the terminal 108. The multiplexer 236 can be implemented as part of the digital circuitry 212 along with the demultiplexer 210 and the synchronization control circuit 102. Thus, in some examples, the system 200 can provide an output clock signal at terminal 108 (instead of receiving an input clock signal) to one or more other instances of the system 200. Each such other instance of the system can be configured to use the output clock signal at 108 from the system 200 as an external clock signal for synchronizing operation of respective power converters with respect to the operation of the power converter controlled by the system 200. Also, multiple power converters can operate out of phase to reduce the total harmonic peak of the switching frequency and, in turn, reduce the total electromagnetic interference.

Figure 3:
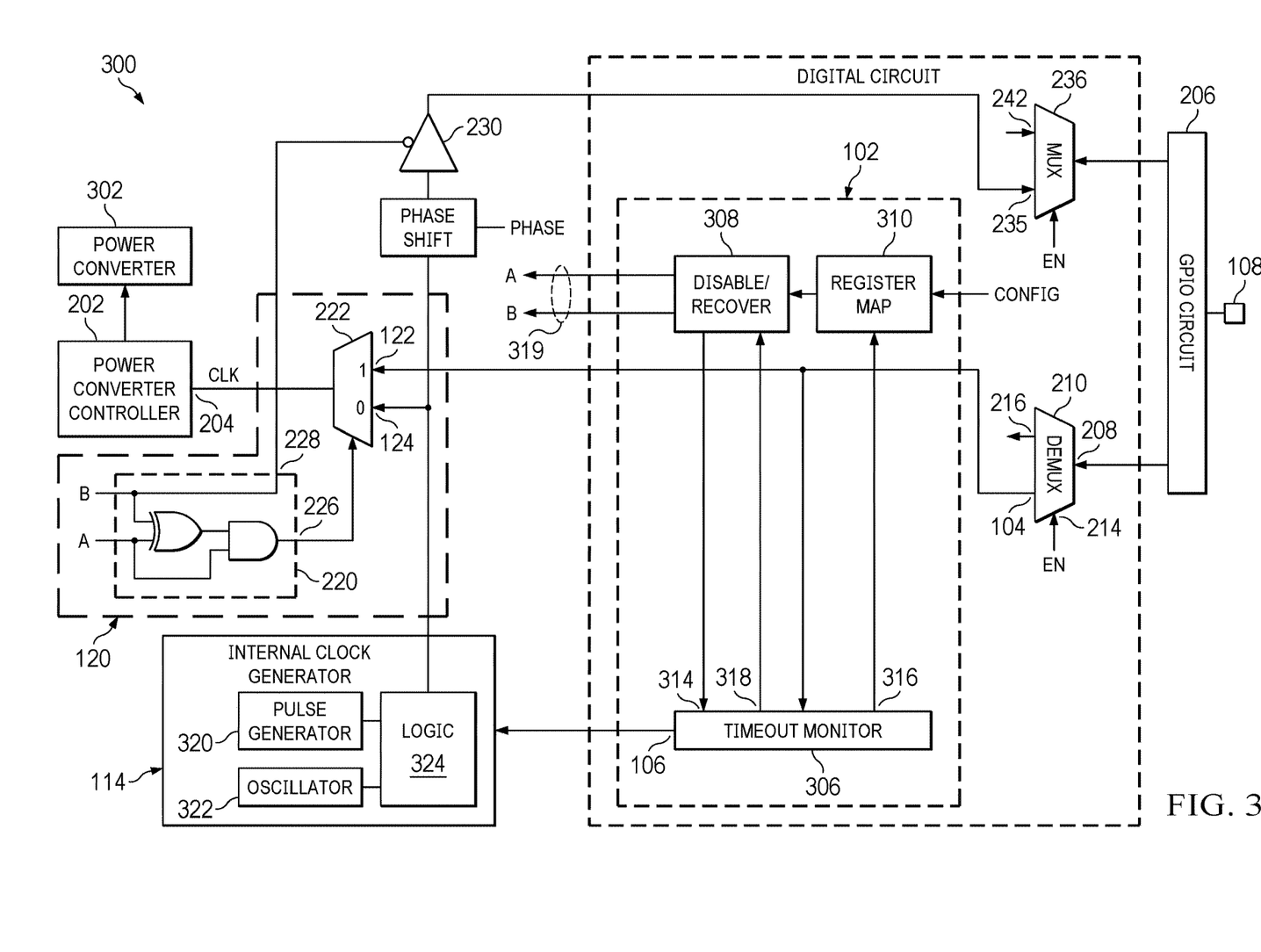
FIG. 3 shows another example of dropout protection circuit implemented in a power delivery control system.

FIG. 3 is a block diagram of an example power delivery system 300 that includes a dropout protection circuit 100. The power delivery system 300 and dropout protection circuit can be implemented according to the example of FIG. 1 or 2. Accordingly, the description of FIG. 3 also refers to FIGS. 1 and 2. The power delivery system 300 includes a power converter controller 202 having an output coupled to a power converter 302. For example, the controller 202 is configured to provide a PWM control signal responsive to the CLK signal to control power switches (e.g., metal oxide semiconductor field effect transistors (MOSFETs)) of a power stage of the converter 302. The power converter 302 can be implemented on a separate IC from the rest of the system 300, including the dropout protection circuit 100. Alternatively, the power converter 302 can be implemented on the same IC as the rest of the system 300. As described herein, the CLK signal at 108 is either an external clock (EXT_CLK) signal, which is received at the sync_in terminal 108 from another circuit (e.g., a clock circuit or another instance of the system 300 or 200), or an internal clock signal generated by the dropout protection circuit 100 or derived from the internal clock signal. The dropout protection circuit 100 includes synchronization control circuit 102, internal clock generator circuit 114 and output circuit 120.

As described with respect to the example of FIG. 2, the power delivery system 300 includes GPIO circuit 206, which is coupled to demultiplexer 210 and multiplexer 236. The GPIO circuit 206 is configured to connect the sync_in terminal 108 with the demultiplexer 210 and multiplexer 236 for receiving and sending clock signals or data. The synchronization control circuit 102 has an input configured to receive the EXT_CLK signal from sync_in terminal 108 through a path that includes the GPIO circuit 206 and demultiplexer 210.

In FIG. 3, the synchronization control circuit 102 includes a timeout monitor 306, disable/recover logic 308 and a register map 310. The timeout monitor 306 has the sync input 104, a fail input 314, and fail outputs 106, 316 and 318. The fail input 314 is coupled to an output of the disable/recover logic 308. The fail outputs 316 and 318 are coupled to respective inputs of the register map 310 and disable/recover logic 308. The timeout monitor 306 is configured to provide an intermediate fail signal at 318 responsive to determining that the EXT_CLK signal at 104 is invalid. For example, the timeout monitor 306 is configured to provide intermediate fail signal responsive to determining a period of the EXT_CLK signal falls outside a time range (e.g., outside minimum and maximum allowed time periods), such as for a number of (e.g., two or more) cycles of the EXT_CLK. In another example, the timeout monitor 306 is configured to determine that the EXT_CLK signal is invalid if the EXT_CLK signal has a frequency outside a valid pass band for a period of time (e.g., a number of clock cycles). The disable/recover logic 308 is configured to provide an automated fail response signal to the fail input 314 responsive to the intermediate fail signal provided (by timeout monitor 306) at 318.

The timeout monitor is further configured to provide a digital sync fail signal at 316 as well as an analog sync fail signal at 106 responsive to the automated fail response at 314. The digital sync fail signal at 316 and the analog sync fail signal at 106 thus have values representative of the EXT_CLK signal determined to be invalid. The register map 310 is configured to set a register entry for an I/O mode register responsive to the digital sync fail signal at 316. The register map 310 can also be configured to store other configuration information to control operating parameters for the synchronization control circuit 102, such as responsive to one or more configuration inputs, shown as CONFIG. The disable/recover logic 308 adds disable and/or recover control functionality to analog sync fail through the logic path that is used to produce the analog sync fail signal ultimately sent into analog domain. The disable/recover logic 308 also can be configured to provide a mode signal 319 having a value, shown as A and B, responsive the I/O mode register. For example, values of A and B are each respective bits of a two-bit binary control word. Other word lengths can be used.

The disable/recover logic 308 is configured to provide the mode signal 319 to respective inputs of the selector logic 220 to control whether (or not) to switch to the internal clock signal through hardware automatically provided at input 124. The disable/recover logic 308 is also configured to provide the mode signal 319 to control switching back to the external EXT_CLK signal provided at input 122 after the EXT_CLK signal has recovered. For example, the timeout monitor 306 is configured to change the state of the signal at 319 responsive to determining that the EXT_CLK signal at 104 is valid. This results in the disable/recover logic 308 also changing the state of the signal 314 to represent a valid EXT_CLK signal. In response, the timeout monitor 306 also changes states of the digital sync fail signal at 316 and the analog sync fail signal at 106 to be representative of the valid EXT_CLK signal. The register map 310 changes the register entry for the I/O mode register responsive to the digital sync fail signal at 316 having a value representative of the valid EXT_CLK signal. The disable/recover logic 308 is configured to change the value of the mode signal 319 responsive to the I/O mode register in the register map 310 to enable the hardware to control the state of sync Jail signal when disable/recover configurations for this are enabled.

In the analog domain (e.g., outside of the digital circuit 212), the internal clock generator 114 is configured to provide the internal clock signal responsive to the analog sync fail signal at 106 having a value representative of an invalid EXT_CLK signal. In the example of FIG. 3, the internal clock generator 114 includes a pulse generator 320, an oscillator 322 and combinational logic 324. The pulse generator 320 and oscillator 322 have outputs coupled to the combinational logic 324. Also, the pulse generator 320 is configured to generate a pulse responsive the analog sync fail signal at 106 (e.g., responsive to the analog sync fail signal being asserted and/or de-asserted). The oscillator 322 is configured to generate a periodic oscillating waveform (e.g., a square wave or a sine wave) responsive the analog sync fail signal at 106. However, there can be a delay between the sync fail signal being asserted and the internal oscillator starting up to provide the periodic waveform. Accordingly, the combinational logic 324 is configured to combine the pulse from the pulse generator, which is generated before the periodic waveform from the oscillator, with the periodic waveform to provide a combined clock signal at the input 124 of the output circuit 120. Thus, if the EXT_CLK signal is lost or otherwise determined to be invalid, the combined clock signal (e.g., the pulse combined with the periodic waveform) can be provided responsive to the sync fail signal. As a result, an internal clock signal can be provided with little or no delay so as to reduce (or prevent) stalling of the the power converter controller 202, and the power converter 302 can likewise continue to supply regulated power to one or more loads.

In the example of FIG. 3, the selector logic 220 includes an arrangement of logic gate 330 and 332 configured to provide a selector signal at 226 responsive to value of A and B of the mode signal 319. For example, the gate 330 is shown as an exclusive-OR gate having inputs configured to receive A and B. The other gate 332 is an AND gate having a first input coupled to the output of gate 330 and a second input configured to receive A. The output of the AND gate 332 is the output 226, and is configured to provide a selector signal at 226 to the control input of multiplexer 222. The multiplexer 222 is configured to provide the CLK signal at 204, responsive to the selector signal at 226, namely, either the EXT_CLK signal received at 122 or the internal clock signal at 124.

Figure 4:
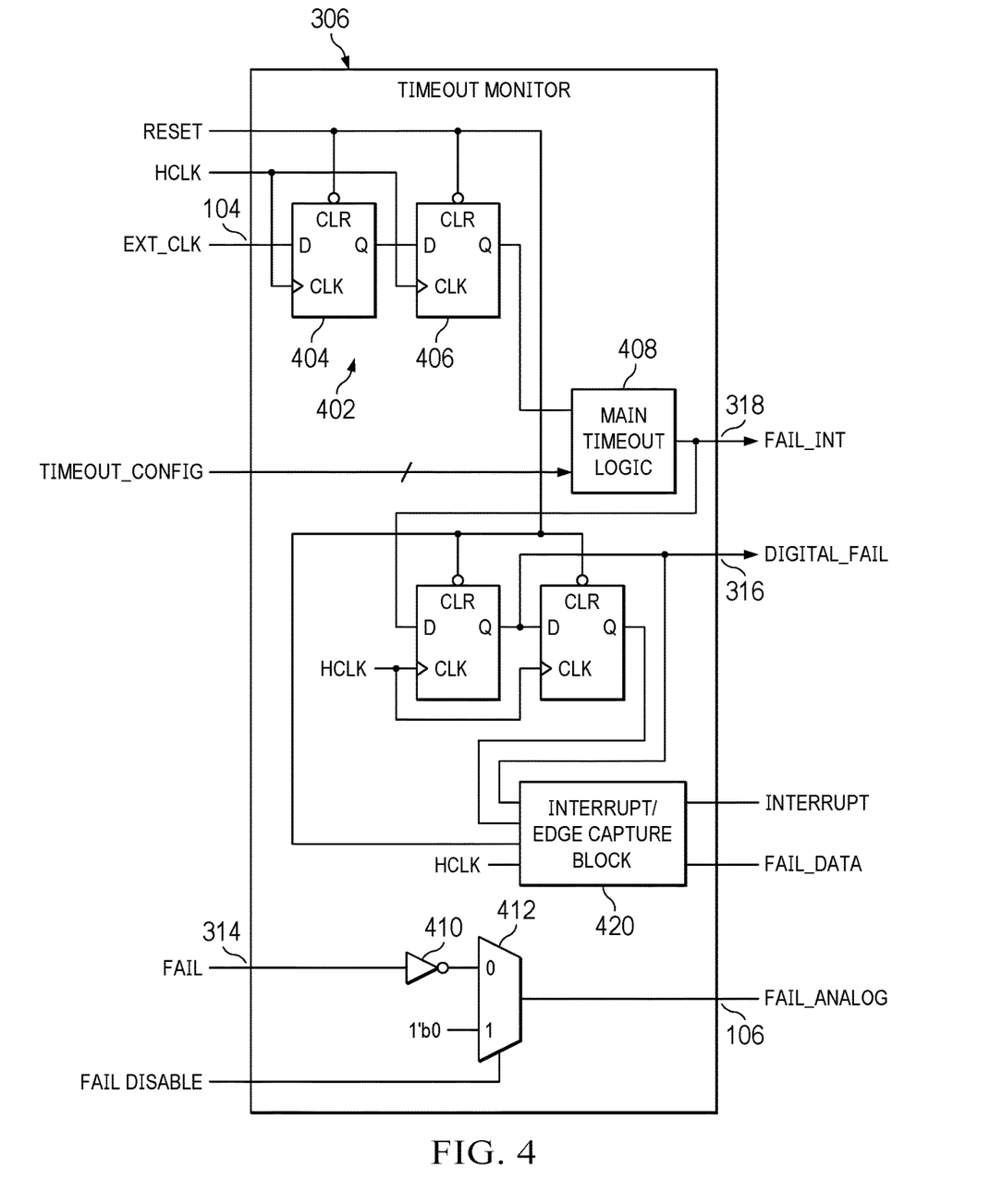
FIG. 4 shows an example timeout monitor that can be implemented in the circuit of FIG. 3.

FIG. 4 shows an example of the timeout monitor 306 that can be implemented in the circuits of FIG. 1, 2 or 3. Accordingly, the description of FIG. 4 also refers to FIG. 1-3. The timeout monitor includes an input stage 402 configured to receive the EXT_CLK signal at input 104 (e.g., from GPIO circuit 206). For example, the input stage 402 includes flip-flops (e.g., D-flip-flops) 404 and 406 coupled in series between the input 104 and main timeout logic 408. The flip-flop 404 has a D-input coupled to input 104, and a Q output of flip-flop 404 is coupled to a D-input of the other flip-flop 406. Respective CLK inputs of flip-flops 404 and 406 are configured to receive a high-speed clock (HCLK) signal. Respective reset (CLR) inputs of the flip-flops 404 and 406 are configured to receive a reset signal, such as to reset each of the flip-flops 404 and 406 to initial values. The Q output of flip-flop 406 is coupled to an input of the main timeout logic 408, and is configured to provide the EXT_CLK signal synchronized into the clock domain of the digital system. For example, the EXT_CLK signal has a frequency of about 400 KHz and the HCLK signal has a frequency of about 24 MHz. The input stage 402 thus is configured to synchronize the change state of EXT_CLK during rising edge of HCLK in order to keep the system in sync with EXT_CLK. Other frequencies could also be used.

The main timeout logic 408 is configured to perform computations to determine whether the period of EXT_CLK signal is within a valid range or outside of the valid range. For example, the main timeout logic 408 can be implemented a finite state machine, such as coded by instructions (e.g., using Verilog) describing a series of case statements or other expressions to model states of a state machine configured to determine the validity or invalidity of the EXT_CLK signal. The main timeout logic 408 can provide the intermediate fail signal (FAIL_INT) at 318 having a value to classify whether the EXT_CLK signal is valid or invalid. For example, if the main timeout logic 408 determines the EXT_CLK signal to be valid, then FAIL_INT=0. If the EXT_CLK signal is invalid, then FAIL_INT=1, which is representative of the frequency of EXT_CLK being either too high or low.

As a further example, the main timeout logic 408 is configured to classify the EXT_CLK signal as invalid within one invalid cycle of the EXT_CLK signal or classify the EXT_CLK signal as valid within a number of valid EXT_CLK cycles responsive to the FAIL_INT signal at 318. Also, responsive to the EXT_CLK signal being considered invalid, the main timeout logic 408 can be configured to classify the EXT_CLK signal as valid again after a number of valid cycles of the EXT_CLK signal have passed through the timeout monitor 306. In an example, two clock cycles of hysteresis are added to the minimum period of the EXT_CLK signal and subtracted from the maximum period requirements. Different amounts of hysteresis offset could be used. The added hysteresis portion helps to ensure that each time the EXT_CLK signal is classified as valid again, that the EXT_CLK signal is comfortably beyond those limits so the main timeout logic 408 does not determine a failure to occur immediately (or over time) again at that passing frequency. In some examples, one or more of the minimum period, maximum period, and number of valid cycles can be configurable, such as responsive to values of one or more TIMEOUT_CONFIG parameters (e.g., stored in respective entries of the register map 310).

As mentioned, the FAIL_INT signal is provided to the disable/recover logic 308, and the disable/recover logic returns the FAIL signal at input 314 responsive to the FAIL_INT signal. The timeout monitor 306 also is configured to generate an analog fail signal, shown as FAIL_ANALOG, responsive to the FAIL signal at 314. For example, the timeout monitor 306 include an inverter 410 and a multiplexer 412 coupled between the input 314 and the output 106. The inverter 410 has an input coupled to input 314 and is configured to invert the FAIL signal and provide the inverted FAIL signal to an input of a multiplexer 412. After the inverter 410, this logic path will make the FAIL_ANALOG signal into the appropriate polarity, such as to designate a logic high to be representative of failure or a logic low to be representative of being within frequency range. Another input of the multiplexer 412 is set to a fixed value (e.g., stored in a register location, shown as 1'b0). A control input of the multiplexer 412 receives a FAIL_DISABLE signal, so the multiplexer provides one of its two inputs to the output 106. The FAIL_DISABLE signal and components 410 and 412 are configured to provide a failsafe auto-disable function in case it becomes necessary to disable the power converter when the EXT_CLK fails and respective hardware 410, 412 controls the FAIL_ANALOG signal at 106. In this way, hardware does not ultimately control sync_in_fail, and firmware would need to make the appropriate configuration adjustments based on the DIGITAL_FAIL signal at 316. That is, firmware can read from a register, such as can be in a form of an interrupt or other entry responsive to the CONFIG input (see FIG. 3), to inform firmware of changes to a respective signal state.

As mentioned, the timeout monitor is configured to provide the digital sync fail signal at output 316 (shown as DIGITAL_FAIL) responsive to the FAIL_INT signal at 318. For example, the timeout monitor 306 includes flip-flops (e.g., D-flip-flops) 414 and 416 coupled in series between outputs 316 and 318. The flip-flop 414 has a D-input coupled to output 318, and a Q output of flip-flop 414 is coupled to a D-input of the other flip-flop 416. The Q output of flip-flop 414 is also coupled to output 316 and thus configured to provide the DIGITAL_FAIL signal, which is the failure status signal sent to be registered within the CONFIG input for firmware read. The DIGITAL_FAIL signal is produced from flip-flop 414 Q output in order for its state change to be in sync with the FAIL_ANALOG signal, changes to the DIGITAL_FAIL and FAIL_ANALOG signals remain synchronized. Respective CLK inputs of flip-flops 414 and 416 are configured to receive the HCLK signal and respective CLR inputs of the flip-flops 414 and 416 are configured to receive the reset signal, as described above.

In a further example, the timeout monitor includes an interrupt and edge capture block 420. The interrupt and edge capture block 420 has inputs configured to receive the Q outputs from respective flip-flops 414 and 416. The interrupt and edge capture block 420 is configured to generate and an interrupt (IRQ) responsive to the DIGITAL_FAIL signal at 316 having a value representative of an invalid EXT_CLK signal. The interrupt signal can be pulsed for one system clock cycle responsive to HCLK. The interrupt and edge capture block 420 can also be configured to provide FAIL_DATA, such as responsive to detecting the invalid condition responsive to capture of rising edges, falling edges, or both.

Figure 5:
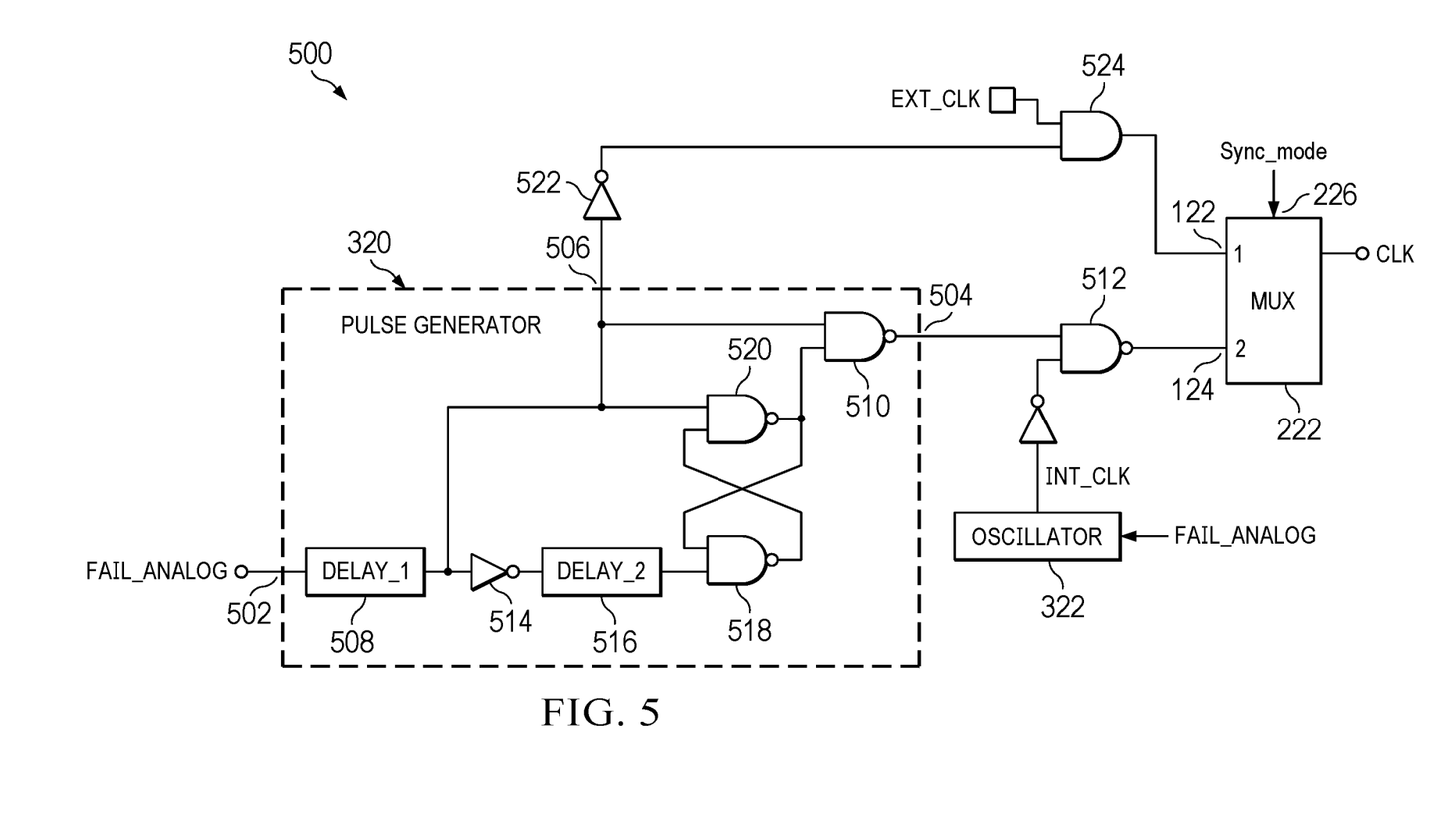
FIG. 5 depicts an example of internal clock generator and selection circuitry.

FIG. 5 depicts an example of clock generator circuitry 500, such as can be implemented in the circuits of FIG. 1, 2 or 3, to generate the CLK signal. Accordingly, the description of FIG. 5 also refers to FIG. 1-3. In the example of FIG. 5, the clock generator circuitry 500 includes the pulse generator 320 having an input 502 and outputs 504 and 506. The input 502 is an input of delay block 508, which is coupled to output 106 of the synchronization control circuit 102 and thus receives the FAIL_ANALOG signal. For example, the delay block 508 has an output coupled to an input of a NAND gate 510. The delay block is configured to delay the FAIL_ANALOG signal (e.g., by a fixed duration) and provide the delayed version of the FAIL_ANALOG signal to the NAND gate 510. The NAND gate 510 has another input is coupled to additional circuitry of the pulse generator 320, which is configured to invert and further delay the delayed version of the FAIL_ANALOG signal provided by delay block 508. Thus, the NAND gate 510 is configured to provide a low pulse at output 504 responsive to the delayed version of the FAIL_ANALOG signal.

The output 504 is coupled to an input of another NAND gate 512. The oscillator 322 is configured to provide an internal clock signal, shown as INT_CLK, responsive to the FAIL_ANALOG signal. However, prior to the FAIL_ANALOG signal, the oscillator 322 is off and during generation of the pulse at 504 the INT_CLK signal is low. An inverter is coupled between the oscillator output and the input of the NAND gate 512, and thus configured to provide an inverted version of the INT_CLK signal to the NAND gate 512. Accordingly, the NAND gate 512 provides a pulse to input 124 of multiplexer 222 responsive to the pulse at 504 and the inverted INT_CLK signal. As described herein, SYNC_MODE signal is provided at 226 to the control input of the multiplexer 222 with a value representative of whether the EXT_CLK signal is valid or invalid. For example, responsive to the synchronization control circuit 102 determining the EXT_CLK signal is invalid, the SYNC_MODE signal at 226 has a value to cause the multiplexer 222 to select input 124, so the multiplexer is configured to provide the CLK signal responsive to the signal at the input 124.

The output of delay block 508 also drives the additional circuitry of the pulse generator 320. For example, the additional circuitry includes an inverter 514, a delay block 516 and NAND gates 518 and 520 coupled between the output of delay block 508, and the NAND gate 510. The pulse generator 320 thus provides a pulse at 504 after the FAIL_ANALOG signal passes through the delay block 508 having a pulse width determined by the second delay block 516. In an example, delay blocks 508 and 516 implement the same delay (e.g., 100 ns), so the pulse at 504 is a low pulse having a falling edge occurring 100 ns after the FAIL_ANALOG signal goes high. The NAND gate 512 inverts the pulse 504 to create a high pulse at 124. The delay implemented by delay block 508 thus ensures that the CLK signal is pulled low and ready for the high pulse that occurs after the initial delay period (imposed by delay block 508). After the initial pulse at 504, the signal at 124 follows the INT_CLK signal. Responsive to the EXT_CLK signal being determined to be valid (e.g., by synchronization control circuit 102), the SYNC_MODE signal at 226 changes values to select to other input 122 for the multiplexer 222. The transition to the input 122 can be substantially instantaneous.

In the example of FIG. 5, the clock generator circuitry 500 includes additional circuitry (e.g., logic) configured to ensure that the input 122 is pulled low for a duration prior to switching back to the EXT_CLK signal. For example, the clock generator circuitry 500 includes an inverter 522 and an AND gate 524 coupled between the pulse generator output 506 and the multiplexer input 122. The inverter 522 is configured to invert the delayed version of the FAIL_ANALOG signal, which is low responsive to a valid EXT_CLK signal. The AND gate 524 is configured to logically AND the EXT_CLK signal and the inverted and delayed version of the FAIL_ANALOG signal. Because the delayed version of the FAIL_ANALOG signal is low until it passes the delay block 508, the AND gate 524 provides a logic low signal pulse to input 122 for at least the duration of the delay implemented by delay block 508. This prevents the CLK signal from having a long HIGH pulse, such as could occur if the INT_CLK and EXT_CLK were to overlap. After the FAIL_ANALOG signal passes through the delay block 508, the AND gate 524 provides the EXT_CLK signal to input 122 responsive to the inverted delayed version of the FAIL_ANALOG signal remaining logic high while the EXT_CLK signal is valid.

Figure 6:
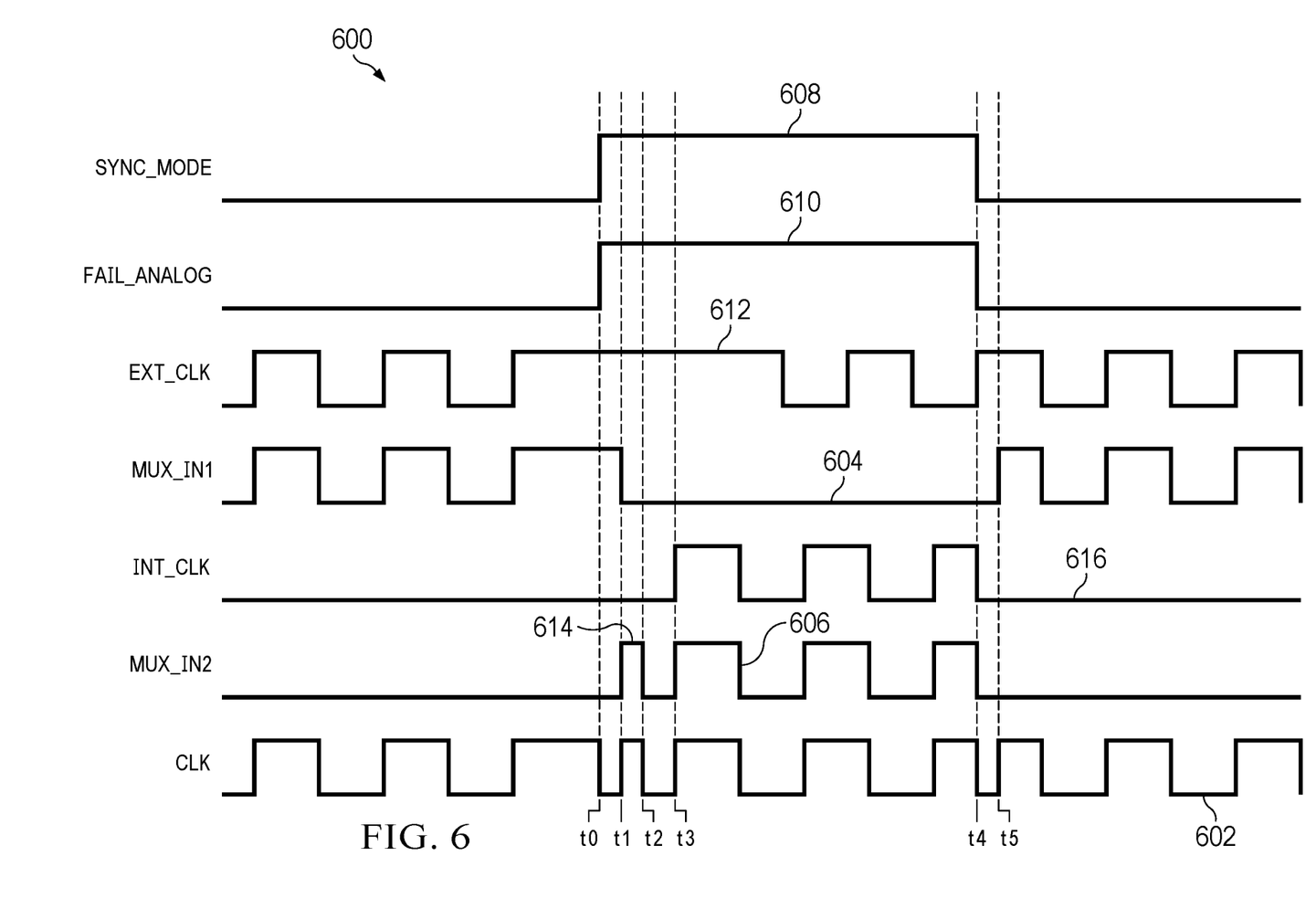
FIG. 6 is a timing diagram showing signals in the circuitry of FIG. 5.

FIG. 6 is a timing diagram 600 showing signals in the circuitry of FIG. 5. Thus, the description of FIG. 6 also refers to FIG. 5. The frequency of the clock signal used to control the logic in the circuit 500 FIG. 5 can be several order of magnitude greater than the EXT_CLK signal so changes in signal states through the various gates appear substantially instantaneous. As described with respect to FIG. 5, multiplexer 222 provides the CLK signal 602 by selecting between signals 604 and 606 at respective multiplexer inputs 122 and 124 responsive to the SYNC_MODE signal 608. The timeout monitor 306 is configured to generate the FAIL_ANALOG signal 610 responsive to the validity of the EXT_CLK signal 612, as described herein.

As shown in the example of FIG. 6, at time t0, the SYNC_MODE and FAIL_ANALOG signals 608 and 610 go high (substantially simultaneously) responsive to the EXT_CLK signal 612 determined to be invalid. Thus, prior to time t0, the EXT_CLK signal 612 was considered valid and was supplied by multiplexer 222 as the CLK signal 602. The pulse generator 320 is configured to generate a pulse 614 responsive to the FAIL_ANALOG signal 610 going high. For example, the NAND gate 512 is configured to provide the pulse 614 responsive to the signal at 504 and an inverted version of the internal clock signal 616. The pulse 614 is provided at the multiplexer input 124 at time t1 following a delay (e.g., implemented by delay block 508). The pulse 614 is pulled low at time t2 according to a further delay (e.g., implemented by delay block 516). As mentioned, the internal clock signal 616 is initially low during generation of the pulse because the oscillator 322 is being activated responsive to the FAIL_ANALOG signal 610. Thus, by providing the pulse 614, the oscillator 322 is afforded time to powers up until it is capable of providing the stable periodic internal clock signal 616, as shown at time t3. As a result, the CLK signal 602 has a continuous pulse train through the transition from the EXT_CLK 612 to the internal clock signal 616. Accordingly, the controller (e.g., a PWM controller) does not stall for too long due to the CLK signal dropping out.

At time t4, the SYNC_MODE and FAIL_ANALOG signals 608 and 610 go low responsive to EXT_CLK signal 612 determined to be valid. As described herein, the synchronization control circuit 102 can determine the EXT_CLK signal 612 determined to be valid again based on the EXT_CLK signal 612 having an acceptable frequency (or period) for a number of cycles. The acceptable frequency range and number of "good" periods to consider the EXT_CLK signal 612 valid can be configurable. Responsive to the SYNC_MODE signal 608 going low, the multiplexer 222 selects the signal 604 at input 122 as the CLK signal 602. As shown in the example of FIGS. 5 and 6, responsive to the FAIL_ANALOG signal 610 going low, an inverted and delayed version of the FAIL_ANALOG signal is ANDed with the EXT_CLK signal 612 to provide the signal 604 at multiplexer input 122. Thus, the signal 604 at multiplexer input 122 remains low for the duration of delay from t4 to t5 (e.g., implemented by delay block 508). After such delay, at t5, the CLK signal 602 follows the EXT_CLK signal 612. By pulling the CLK signal low for the time from t4 to t5, the EXT_CLK signal 612 is prevented from having an excessively long high signal at the transition from the internal clock signal 616 to the EXT_CLK signal 612, which further reduces or prevents disturbing operation of the power converter.

Figure 7:
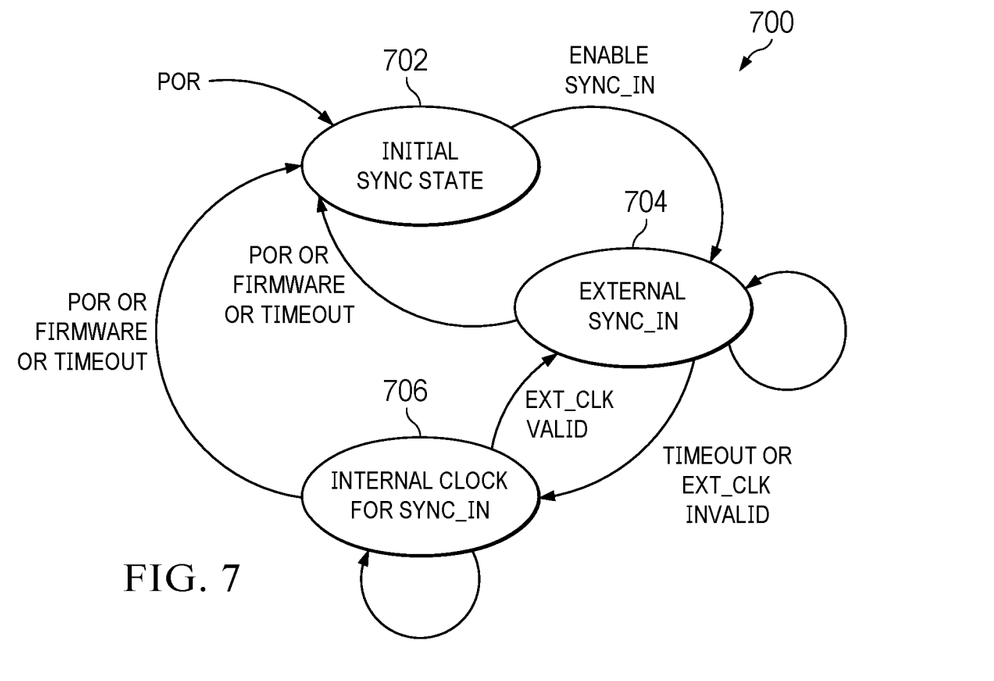
FIG. 7 is a state diagram showing example state transitions for disable/recover logic of the synchronization control circuit.

FIG. 7 is a state diagram 700 showing example state transitions for disable/recover logic 308 of the synchronization control circuit 102. At power-on reset, the logic enters an initial synchronization state 702, in which an external sync_in terminal is not enabled and/or mode register are not set to starting value for timeout monitor to be enabled. In the state 702, entries for DIGITAL_FAIL and FAIL_ANALOG signals are set to initial values (e.g., 0) representative of a valid EXT_CLK signal. The logic 308 transitions from the initial synchronization state 702 to an external sync_in state 704 responsive to external sync_in function being enabled. For example, the external sync_in function is enabled responsive to a mode register and timeout function being set. In the external sync_in state 704, the register entries remain at their initial values to provide the DIGITAL_FAIL, FAIL_ANALOG and SYNC_MODE signals with values representative of a valid EXT_CLK signal. Also during the external sync_in state 704, the timeout monitor 306 interprets the EXT_CLK signal as valid, so the EXT_CLK signal is used as the output CLK signal.

The logic 308 transitions from the external sync_in state 704 to the internal clock for sync_in state 706 depending on frequency of the EXT_CLK signal or a timeout condition occurs. In an example, the frequency is evaluated based on the amount of time between sequential rising edges of EXT_CLK signal relative to the system clock (e.g., HCLK). For example, if the EXT_CLK signal toggles too quickly within two rising edges at the point that the timeout monitor is enabled (e.g., in state 704), the EXT_CLK signal would fail if it takes less than the count value set in a first timeout register entry (e.g., set by a timeout check). Also, if the EXT_CLK signal toggles too slowly, then the EXT_CLK signal would fail if it takes a greater than the count value set in a second timeout register entry. The logic 308 remains in the external sync_in state 704 absent one of the foregoing conditions and absent a timeout condition being met for remaining in the sync_in state for a duration that exceeds a timeout limit. In the internal clock for sync_in state 706, register entries are set to provide the DIGITAL_FAIL, FAIL_ANALOG, and SYNC_MODE signals with values representative of an invalid valid EXT_CLK signal. Also, the SYNC_MODE signal is set to control multiplexer 222 to select internally generated clock (e.g., INT_CLK) to provide the output CLK signal.

The logic 308 can transition from the internal clock for sync_in state 706 back to the external sync_in state 704 responsive to the EXT_CLK signal becoming valid again. For example, in order for EXT_CLK signal to be valid the frequency of the EXT_CLK signal needs to be within a valid frequency range and needs to provide a good EXT_CLK signal for a number (e.g., 4, 8, 16 or 32) of consecutively valid cycles of the EXT_CLK signal. In this case, two constraints must be satisfied for SYNC_IN to be valid. Each of the constraints implement hysteresis by adding or subtracting count values, such as to include two additional system clock cycles, which are added to or subtracted from respective count values for the EXT_CLK signal. A first constraint can be implemented to ensure that the EXT_CLK signal does not toggle too quickly (e.g., toggle time≥CLK_1_TIMEOUT_COUNT+2). A second constraint can be implemented to ensure that the EXT_CLK signal does not toggle too slowly (e.g., toggle time≤CLK_1_TIMEOUT_COUNT−2).

The logic 308 can be configured to return to the INITIAL_SYNC state 702, from any other states (e.g., from state 704 or 706) responsive to a POR, a timeout condition or being forced back to the initial state by a firmware command. For example, a microcontroller can be coupled to circuit 100 or to system 200, 300 and be configured to provide a command to firmware to implement the state change.

Figure 8:
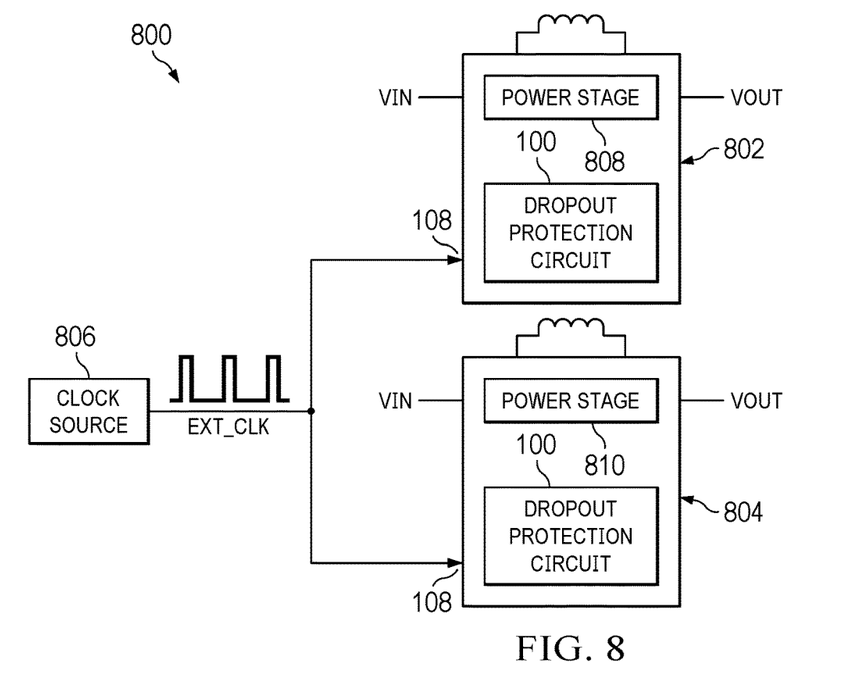
FIG. 8 depicts an example power supply system that can be configured to implement dropout protection circuitry.
Figure 9:
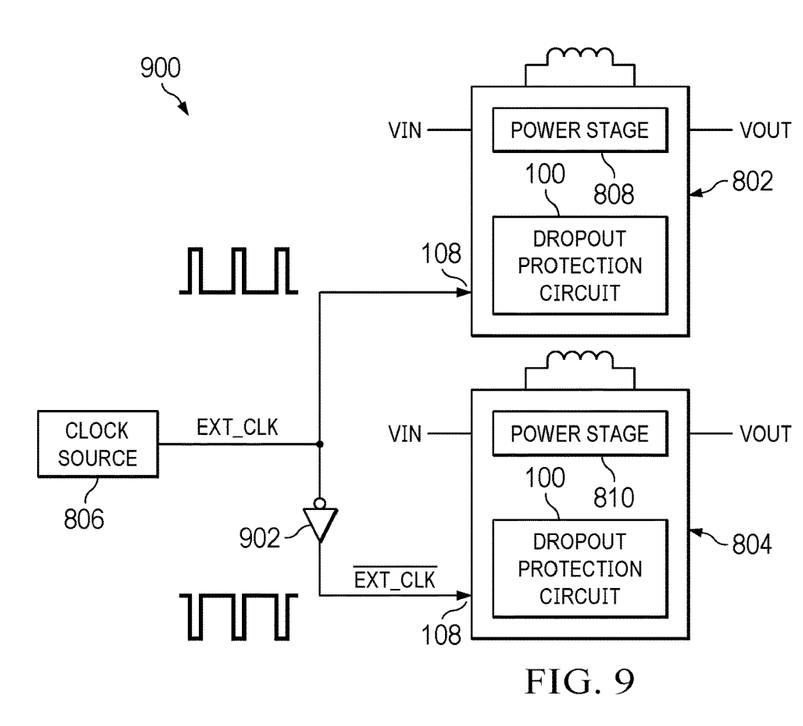
FIG. 9 depicts another example power supply system that can be configured to implement dropout protection circuitry.

FIGS. 8 and 9 depict examples of respective power delivery systems 800 and 900 that can be configured to implement dropout protection circuitry 100. In the example of FIG. 8, the system 800 includes multiple power supplies 802 and 804, each having a respective input (e.g., sync_in input terminal 108) coupled to a clock source 806. Each power supply 802 and 804 can be configured as a switching power supply, such as boost, buck, buck-boost, or other power converter topology, configured to convert an input voltage VIN into an output voltage VOUT. Also, each power supply 802 and 804 can be implemented as an IC, SoC, or on a circuit on one or more printed circuit boards. In another example, the power supplies 802 and 804 can be implemented on the same IC or SoC. In yet another example, each power delivery system 800, 900 can be implemented as an IC or SoC; however, the inductor can be an external component.

The clock source 806 is configured to provide a common external clock signal (EXT_CLK) to which each power supply is synchronized. For example, each power supply 802 and 804 includes a respective power stage 808 and 810. The power stage 808 and 810 can be controlled by a power delivery controller (e.g., controller 202) within the power supply 802 and 804 responsive to a PWM control signal, which has a frequency that is set responsive to a CLK signal. As described herein, the CLK signal can be the EXT_CLK signal, if valid, or an internal clock signal provided by the dropout protection circuit 100. In the example of FIG. 8, the EXT_CLK signals received by each of the power supplies 802 and 804 are in phase.

The example power delivery system 900 of FIG. 9 is identical to the system of FIG. 8 except that the clock signals received by each power supply 802 and 804 are out of phase. For example, an inverter 902 is coupled between the output of the clock source 806 and the sync_in terminal 108 to provide an inverted version of the EXT_CLK signal.

In view of the foregoing, this description provides dropout protection for a circuit, such as a power converter (e.g., a DC-DC converter) that uses an external clock signal. With suitable configuration, dropout protection can flexibility to select the frequency range, and number of "good" periods that fall within the acceptable frequency range. This solution automatically switches in and out of the external clock source, without disturbing the DC-DC converter. Compared to an existing design, such as one configured to use a PLL to lock onto an external clock, the approach described herein can be simpler, use less area (e.g., on a substrate), and consume less power.

In this description, the term "couple" or "couples" means either an indirect or direct connection. Thus, if a first device couples to a second device, that connection may be through a direct connection or through an indirect connection via other devices and connections. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Also, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer, IC or SoC package) and may be configured to couple to at least some of the passive elements and/or the sources to form the described structure, either at a time of manufacture or after a time of manufacture, such as by an end user and/or a third party.

Unless otherwise stated, in this description, "about," "approximately" or "substantially" preceding a term means +/−5 percent (5%) of the stated result. For example, "substantially immediately" means being within +/−0.1 ms of instantaneous when a prescribed delay would be 2.0 ms.

The recitation "based on" means "based at least in part on." Therefore, if X is based on Y, X may be a function of Y and any number of other factors. Similarly, the recitation "responsive to" means "responsive at least in part to." Therefore, if X is responsive to Y, X may be a function of Y and any number of other factors.

Modifications are possible in the described embodiments, and other embodiments are possible, within the scope of the claims.

What is claimed is:

1. A circuit comprising:
a synchronization control circuit having a sync input, a sync output, and a sync control output, the sync input coupled to a sync terminal configured to receive an external clock signal;
an internal clock generator circuit having an output; and
an output circuit having first and second signal inputs, a mode control input and a clock output, the first signal input coupled to the sync input, the second signal input of the output circuit coupled to the output of the internal clock generator circuit, the mode control input coupled to the sync control output, the clock output adapted to be coupled to a controller, wherein the internal clock generator circuit comprises:
a pulse generator having an input and an output, the input coupled to the sync output, and the output coupled to the second signal input; and
an oscillator having an output coupled to the second signal input.

2. The circuit of claim 1, further comprising combinational logic having first and second inputs and an output, in which the first input is coupled to the output of the pulse generator and the second input is coupled to the output of the oscillator, and the output of the combinational logic is coupled to the second signal input of the output circuit.

3. The circuit of claim 1, wherein the synchronization control circuit is configured to provide a sync fail signal at the sync output responsive to determining the external clock signal is invalid, the output circuit configured to couple the output of the output circuit to the second signal input responsive to the sync fail signal.

4. The circuit of claim 3, wherein the synchronization control circuit comprises a timeout monitor configured to determine the external clock signal is invalid responsive to the external clock signal having a period outside allowed minimum and/or maximum periods.

5. The circuit of claim 4, wherein the synchronization control circuit further comprises logic having a state machine configured to provide a digital fail signal responsive to the sync fail signal having a value representative of the external clock signal being invalid, the timeout monitor configured to provide an analog sync fail signal synchronized with the digital fail signal having a value representative of the external clock signal being invalid.

6. The circuit of claim 5, wherein the pulse generator is configured to provide a pulse at the output of the internal clock generator circuit responsive to a change in the analog sync fail signal.

7. The circuit of claim 6, wherein the pulse generator is configured to provide a positive pulse responsive to the analog sync fail signal having a value representative of the external clock signal being invalid and a negative pulse responsive to the analog sync fail signal having a value representative of the external clock signal being valid.

8. The circuit of claim 5, wherein the logic has a mode output coupled to the mode control input of the output circuit, the logic configured to provide a synchronization mode signal at the mode output responsive to the sync fail signal having a value representative of whether the external clock signal is valid or invalid.

9. The circuit of claim 8, wherein the output circuit is configured to provide one of the external clock signal or an internal clock signal at the clock output responsive to the synchronization mode signal, the internal clock generator circuit configured to provide the internal clock signal.

10. The circuit of claim 1 implemented as an integrated circuit, in which the synchronization control circuit, the internal clock generator circuit, and the output circuit are implemented on a common substrate, the integrated circuit comprising a power converter controller having a clock input coupled to the clock output of the output circuit.

11. A circuit comprising:
a synchronization control circuit configured to provide a sync control signal responsive to determining an invalidity or validity of an external clock signal;
an internal clock generator configured to provide an internal clock signal, wherein the internal clock generator includes:
an oscillator configured to provide a periodic waveform; and
a pulse generator; and
an output circuit coupled to the synchronization control circuit and the internal clock generator, wherein the output circuit is configured to receive the internal clock signal and provide one of the external clock signal or the internal clock signal as an output clock signal responsive to the sync control signal.

12. The circuit of claim 11, wherein the synchronization control circuit comprises a timeout monitor configured to monitor the external clock signal and determine a validity of the external clock signal responsive to evaluating a period of external clock signal relative to minimum and/or maximum allowed periods, in which the external clock signal is invalid if the external clock signal has a period outside of the minimum and/or maximum allowed periods.

13. The circuit of claim 12, wherein the timeout monitor is configured to provide a sync fail signal responsive to determining the external clock signal is invalid.

14. The circuit of claim 13, wherein the synchronization control circuit further comprise logic having a state machine configured to provide a digital fail signal responsive to the sync fail signal having a value representative of the external clock signal being invalid, the timeout monitor configured to provide an analog sync fail signal responsive to the digital fail signal having a value representative of the external clock signal being invalid.

15. The circuit of claim 14, wherein:
the pulse generator is configured to provide a pulse responsive to a change in the analog sync fail signal; and
the internal clock generator includes combinational logic configured to combine the pulse and the periodic waveform to provide the internal clock signal.

16. The circuit of claim 15, wherein the pulse generator is configured to provide a positive pulse responsive to the analog sync fail signal having a value representative of the external clock signal being invalid and a negative pulse responsive to the analog sync fail signal having a value representative of the external clock signal being valid.

17. The circuit of claim 14, wherein
the logic is configured to provide a synchronization mode signal responsive to the sync fail signal having a value representative of whether the external clock signal is valid or invalid, and
the output circuit is configured to provide one of the external clock signal or the internal clock signal as an output clock signal responsive to the synchronization mode signal.

18. The circuit of claim 11 implemented as an integrated circuit, in which the synchronization control circuit, the internal clock generator and the output circuit are implemented on a common substrate, the integrated circuit comprising a power converter controller configured to generate a pulse-width modulated signal responsive to the output clock signal.

19. A system comprising:
a dropout protection circuit comprising:
a synchronization control circuit having a sync input, a sync output, and a sync control output, the sync input coupled to a sync terminal configured to receive an external clock signal;
an internal clock generator circuit having a control input and an output, the control input coupled to the sync control output; and an output circuit having first and second signal inputs, a mode control input and a clock output, the first signal input coupled to the sync input, the second signal input of the output circuit coupled to the output of the internal clock generator circuit, the mode control input coupled to the sync control output;

a controller having a clock input and a control output, the clock input coupled to the clock output of the output circuit; and a power converter having a power control input coupled to the control output of the controller, wherein the internal clock generator circuit includes:

a pulse generator having an input and an output, the input coupled to the sync output, and the output coupled to the second signal input; and an oscillator having an output coupled to the second signal input.

20. The system of claim 19, wherein the synchronization control circuit is configured to provide a sync control signal having a respective value responsive to determining an invalidity or validity of the external clock signal, the internal clock generator circuit is configured to provide an internal clock signal, the output circuit is configured to provide one of the external clock signal and the internal clock signal as an output clock signal at the clock output responsive to the sync control signal, and the controller configured to provide a pulse-width modulated signal at the control output responsive to the output clock signal.

* * * * *